United States Patent [19]

Heiblum

[11] 4,286,275
[45] Aug. 25, 1981

[54] SEMICONDUCTOR DEVICE

[75] Inventor: Mordehai Heiblum, Yorktown Heights, N.Y.

[73] Assignee: International Business Machines Corporation, Armonk, N.Y.

[21] Appl. No.: 118,251

[22] Filed: Feb. 4, 1980

[51] Int. Cl.$^3$ ............................................ H01G 29/88
[52] U.S. Cl. ........................................ 357/12; 357/4; 357/16; 357/57
[58] Field of Search ................... 357/16, 12, 4, 57

[56] References Cited

U.S. PATENT DOCUMENTS

| | | | |
|---|---|---|---|
| 3,250,966 | 5/1966 | Rose | 357/4 |
| 3,310,685 | 3/1967 | Schmidlin | 357/4 |
| 3,329,823 | 7/1967 | Handy et al. | 357/4 |
| 3,372,315 | 3/1968 | Hartman | 357/12 X |
| 3,447,045 | 5/1969 | Hickmott | 357/4 |
| 3,569,801 | 3/1971 | Giaeves | 357/4 |
| 3,929,527 | 12/1975 | Chang | 148/175 |
| 3,947,681 | 3/1976 | Javan | 290/41 J |
| 3,993,963 | 11/1976 | Logan | 357/18 X |
| 4,017,332 | 4/1977 | James | 357/16 |
| 4,173,763 | 11/1979 | Charg et al. | 357/12 |

OTHER PUBLICATIONS

Heiblum, Characteristics of Metal-Oxide-Metal Devices, PhD Thesis, University Microfilms International, Ann Arbor, MI, 1980.
Mead, I.R.E., Dec. 28, 1959, pp. 359 et seq.
Spratt et al., Phys. Rev. Ltrs. 6, 341, 1961.

Primary Examiner—Martin H. Edlow
Attorney, Agent, or Firm—Alvin J. Riddles

[57] ABSTRACT

A three-terminal semiconductor device having a switching time in the vicinity of $10^{-12}$ seconds and exhibiting a dynamic negative resistance is made up of a thin barrier region in the emitter section having a barrier height that is higher than a wider barrier region in the collector section separated by a base region having a width comparable to the mean-free path length of a majority carrier. The device employs quantum mechanical tunneling as the dominant current flow mechanism from the emitter region to the base region and hot majority carrier transfer as the dominant current flow mechanism through the base region to the collector region.

8 Claims, 5 Drawing Figures

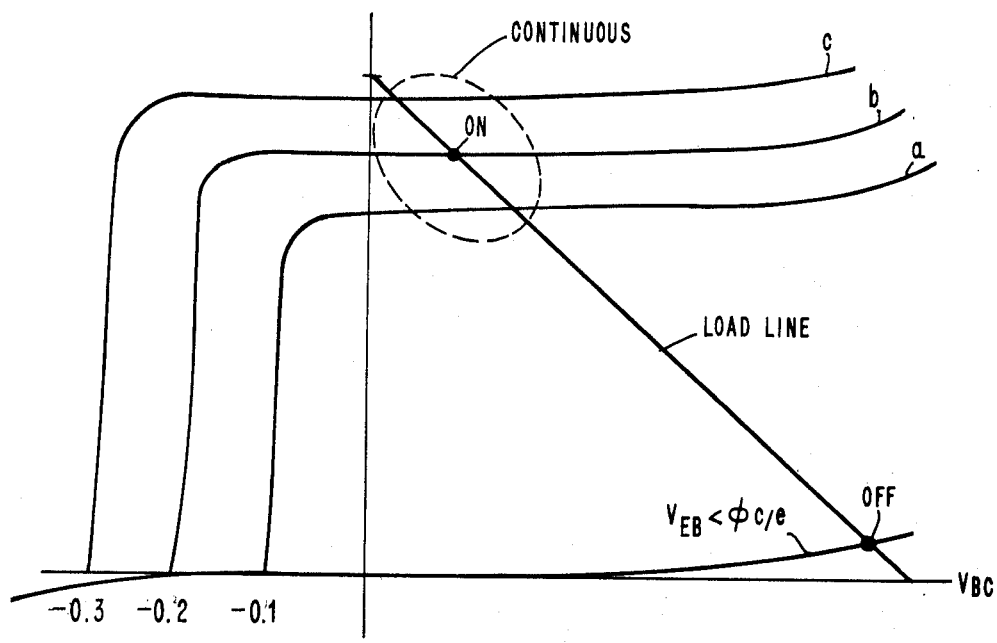
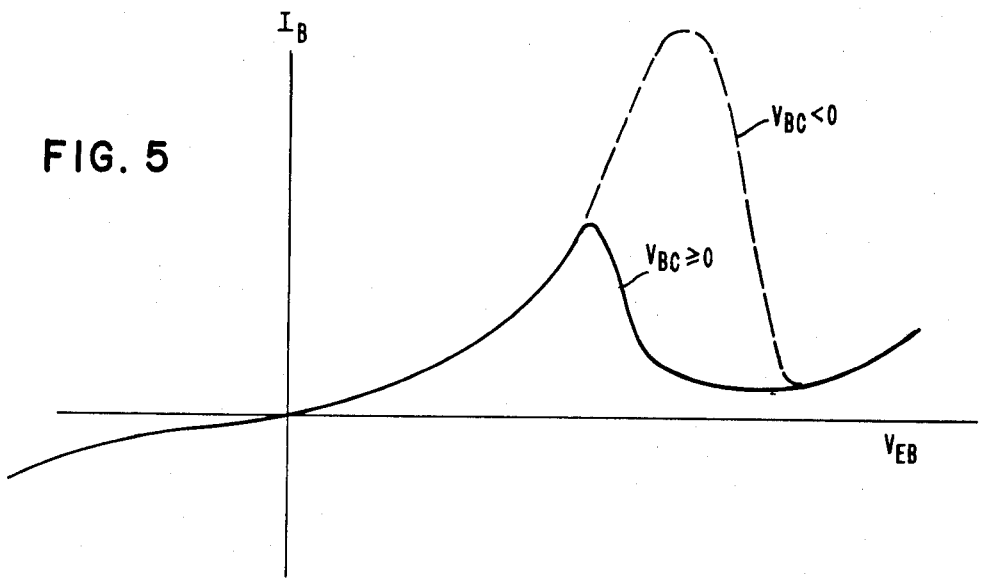
FIG. 5

SEMICONDUCTOR DEVICE

DESCRIPTION

1. Technical Field

The technical field of the invention is that of semiconductor devices having three-terminals which can be operated for amplification, switching or dynamic resistance purposes.

2. Background Art

Semiconductor devices of the three-terminal or transistor type have been progressing in providing shorter switching times and larger signal amplification bandwidths. In advanced performance requirements the standard mode of operation in such devices involving carrier motion in the base by diffusion, it has become increasingly difficult to achieve the switching times and the bandwidths desired.

A device has appeared in the art and is described in *PROC. IRE*, Vol. 48, No. 359, 1960 and *Journal of Applied Physics*, Vol. 32, p. 646, 1961 which involves a five thin-layer device of alternating metal and oxide. Such devices provide base carrier transport by hot electron flow and hence have great promise of speed improvement. However, such devices also have problems involving metal and oxide interfaces and the solution to the problems separates the theoretical advantages from the practical realization. Some efforts at solving the problems and thereby improving the metal and oxide device were set forth in *Physical Review Letters*, Vol. 6, p. 341, 1961 which described a Schottky barrier contact as the collector portion of the metal oxide structure. Such a device, also while showing great performance promise, still requires solution to problems of growing pin-hole free metal on top of oxides or semiconductors.

BRIEF DESCRIPTION OF THE DRAWINGS

FIG. 4 is a graph illustrating the output characteristics of the device of the invention.

FIG. 5 is a graph illustrating the input characteristics of the device of the invention.

DISCLOSURE OF INVENTION

Figure 1:
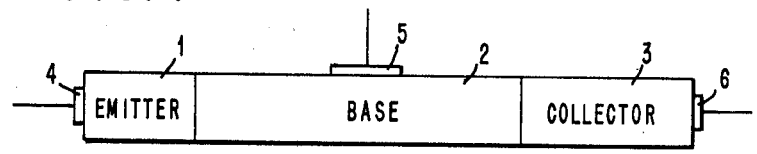
FIGS. 1, 2 and 3 are a dimensionally correlated series of illustrations of the structure, the energy levels and the bias conditions of the device of the invention.

The invention involves a three-terminal semiconductor device with the following conditions in the structure. The barrier height and the barrier width for the emitter or carrier injecting region are selected such that the dominant current injection mechanism is that of quantum mechanical tunneling. The base width is such that the dominant current conduction mechanism in the base region is that of hot majority carrier transfer.

By hot majority carriers is meant carriers with excess energy compared with thermal carriers or compared with the Fermi level. Since electrons have higher mobility and most devices are constructed using electrons as majority carriers, the discussion and illustrations are directed to electron flow, it being understood that one skilled in this art could readily make the appropriate substitutions in the light of the principles set forth for conversion to the use of holes as majority carriers.

The barrier height for the collector region is selected to be lower than that of the barrier height of the emitter so that majority carrier current under the hot electron or majority carrier transfer mechanism with an attendant relatively long mean-free path can traverse the collector barrier. The width of the collector barrier is made wide so that tunneling current will be negligible.

The resulting structure provides switching times as short as $10^{-12}$ seconds and a band width which extends from d.c. up to the infrared frequencies of $10^{-12}$ cycles per second. The device further provides a dynamic negative resistance when connected in a two-terminal mode.

The device of the invention is constructed so that quantum mechanical tunneling will be the dominant mechanism of conduction between emitter and base under a biasing voltage.

When the emitter is biased negatively with respect to the base, electrons will tunnel through the barrier and appear in the base with energy close to the Fermi energy of the emitter which is a function of the bias in excess of that in the base. Those electrons in the base with the excess energy will be able to surmount the collector barrier and be collected.

The hot electron mean-free path is strongly influenced by the excess energy of the electron and decreases sharply with increase in excess energy as a result of the collision rate increase between the hot electrons, thermalized electrons and optical phonons.

The energy distribution of a tunneling current will be fairly mono-energetic. The half width is less than 0.1 electron volts at room temperature under conditions where the collector barrier height is less than the emitter base voltage.

The base region is heavily doped to enable an ohmic contact with minimum heat treatment and the base width is thin and is selected to be less than the mean-free path of an electron which is in the vicinity of 100 A. The collector barrier should be lower than the emitter barrier and a barrier of the order of 0.2 electron volts is satisfactory. The selected low barrier height for the collector barrier enables the hot electron current which is the main conduction mechanism in the base to be relatively effective for hot carriers with low excess energy. Since a relatively long mean-free path in the base is provided, the thin base region will enable the hot electrons to traverse it with minimum scattering and minimum transit time.

The base-to-collector barrier width is chosen so that electron-phonon collisions will be minimized but still tunneling current will be negligible compared to the hot electron current. Under these conditions only contribution to the collector current will be from the hot electrons which traverse the base.

The collector current then will be roughly independent of the base-to-collector voltage when the base-to-collector voltage is greater than 0. This permits the collector potential to be positive with respect to the base and the collector current to be equal to the transmission coefficient multiplied by the emitter current independent of $V_{BC}$. This set of conditions permits the dynamic resistance of the device to be very high and permits a large load impedance which in turn provides a power gain.

When the device is operated in the two-terminal fashion by having the collector shorted to the base or by having a positive collector-base bias, a negative resistance can be observed.

Referring to FIG. 1 a schematic of a standard three-terminal semiconductor device is illustrated having an emitter or current injection region 1, a base region 2, and a collector region 3 with respectively an input ohmic contact 4 to the emitter region, a base ohmic contact 5 and a collector ohmic contact 6.

Figure 2:
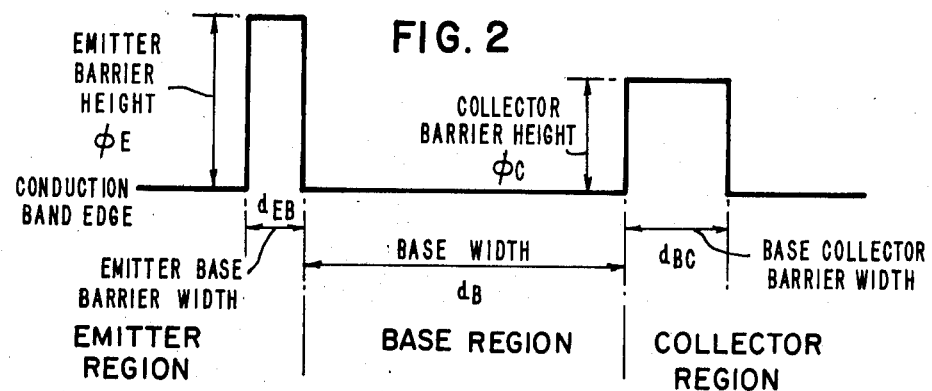

Referring to FIG. 2 an energy diagram is provided that is dimensionally correlated with the structure of FIG. 1 and showing the position of the conduction band in different portions of the device. The emitter region 1 has a section that involves a precise barrier height, $\phi_E$, and a very narrow barrier width, $d_{EB}$. The base region has a precise width $d_B$. A precise collector barrier height labelled $\phi_C$ is provided which is less than the emitter barrier height, $\phi_E$. The collector region has a collector barrier width $d_{BC}$ that is wider than the emitter barrier width.

Figure 3:
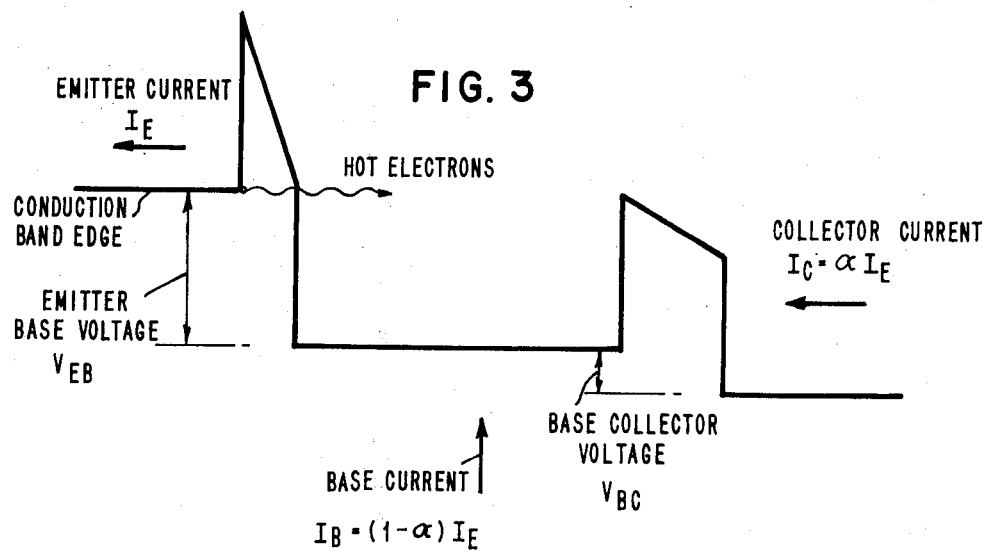

Referring next to FIG. 3 an energy diagram is provided again dimensionally correlated with both FIG. 1 and FIG. 2 and illustrating the conduction band edge under the influence of bias wherein the magnitude of the emitter-base bias voltage and the base-collector bias voltage are each illustrated as well as the respective currents appearing at the emitter contact 4, the base contact 5 and the collector contact 6 in FIG. 1.

The device may be operated as an amplifier, as a switching device or as a negative resistance device.

Referring next to FIG. 4, the output characteristics of the device of the invention are illustrated. A graph is provided wherein collector current is plotted versus base-collector voltage, and emitter-base voltage ($V_{EB}$) is a parameter.

Three operating characteristic lines are illustrated for progressively larger $V_{EB}$ bias values labelled a, b and c, where for each value respectively $V_{EB}=\phi_{c/e}+0.1$, 0.2 and 0.3 volts. A load line is drawn indicating the location of both an "on" and an "off" switching conditions. A region for continuous operation is illustrated.

The device of the invention exhibits a dynamic negative resistance when operated in the two-terminal mode.

Referring next to FIG. 5, the input characteristics in a common emitter curcuit configuration are illustrated. The base current increases monotonically to a maximum at a particular value of emitter-base bias and thereafter decreases exhibiting a negative resistance characteristic. The onset of the negative resistance region can be controlled as illustrated by a dotted line for the condition base-collector voltage less than 0 whereas the solid line illustrates the condition where the base-collector voltage is equal or greater than 0. The onset of negative resistance may also be controlled by the varying of the collector barrier height. The onset of negative resistance value is $\phi_{c/e}$ at $V_{BC}=0$ for the condition $V_{BC} \geq 0$ and $\phi_{c/e}$ at $V_{BC}=0+$ the absolute value of $V_{BC}$ for the condition $V_{BC}<0$.

BEST MODE FOR CARRYING OUT THE INVENTION

Referring to FIGS. 1, 2 and 3 together. The emitter barrier height and emitter-base barrier width for the emitter region 1 may be provided by having the main portion of the emitter region be made of gallium arsenide semiconductor material and the barrier portion made of epitaxially compatible gallium aluminum arsenide, $Ga_xAl_{1-x}As$ where x is about 0.4. This provides a barrier $\phi_E$ of approximately 0.4 Ev. The barrier width should be such that quantum mechanical tunneling can take place. A dimension in the vicinity of 80 A, is satisfactory. The base region 2 may be made of gallium arsenide which is heavily doped to about $10^{18}$ atoms/cc to insure ability to provide an ohmic contact for the base contact 5, and to reduce the base spreading resistance.

The collector region 3 may be gallium aluminum arsenide in the barrier region having a lower quantity of aluminum. In other words, $Ga_xAl_{1-x}As$ where x is now about 0.2 in contrast to 0.4 for the emitter barrier. The remainder of the collector is GaAs. The emitter and collector regions are usually terminated on the contact sides with a heavily doped layer (n+:GaAs) to minimize the contact resistance.

In the light of the principles set forth it will be apparent that other materials satisfy the criteria of the invention. It is essential that the materials and structure cooperate so that the emitter barrier is the higher barrier but that it be thin enough for tunneling; that the base be sufficiently thin of the order of the mean-free travel length of a majority carrier, usually an electron, insuring thereby that the hot electron current will be the dominant conducting mechanism and that the collector barrier be lower than the emitter barrier yet wide enough to prevent tunneling.

As an example of other materials GaAs and Ge are epitaxially compatible and provide different energy gaps. The structure can be fabricated by a number of semiconductor techniques, the molecular beam epitaxy process being preferred because of good controllability.

For the GaAs-GaalAs semiconductor materials, the emitter barrier width should be about 80 A and the collector barrier width should be in the vicinity of 120–150 A.

One of the governing considerations in the thickness of the tunneling barrier is the effective mass of the electrons. Tunneling is strongly dependent upon the product of the distance and the effective mass. The selection of the emitter-base barrier width and collector-base barrier width may be determined for individual materials by Equation 1 for the emitter situation and Equation 2 for the collector situation.

$$\left(\frac{m^*_{EB}}{m_o}\right) d_{EB} \cong 15 \ [A] \qquad \text{Equation 1}$$

$$\left(\frac{m^*_{BC}}{m_o}\right) d_{BC} \cong 25 \ [A] \qquad \text{Equation 2}$$

where $m_o$ is the mass of the free electron.

$m^*_{EB}$ is the electron effective mass in the emitter barrier, and $m^*_{BC}$ is the electron effective mass in the collector barrier.

Referring next to FIG. 3. An advantage in providing minimum energy spread of the tunneling current can be supplied when the emitter bias is very close to the magnitude of the emitter barrier. For the materials GaAs and GaAlAs, the emitter barrier could satisfactorily be in the vicinity of 0.4 electron volts, the collector barrier could satisfactorily be in the vicinity of 0.2 to 0.35 electron volts and the emitter base bias voltage in the vicinity of 0.35 to 0.5 volts.

The traverse time in the base which effects both the switching time and the band width of the device may be maximized by making both the base width and the collector barrier width in the 100 A to 200 A range for the materials GaAs and GaAlAs. The 100 A to 200 A width of the collector barrier will minimize the effective tunneling.

In the switching mode indicated by the "on" and "off" positions illustrated in FIG. 4, the amount of increase in base-emitter voltage and the amount of increase in emitter current which are needed to switch the device are determined by the energy width of the current distribution of the tunneling electrons through the emitter barrier. In fabricating the device, care should be taken that base spreading resistance is minimized and that a good low resistance ohmic contact to the base be made.

These goals are achieved without reducing the mean-free path of the hot electrons in the base, by heavily doping the adjacent barrier regions. Under these conditions the free electrons from the conduction band in the barrier region will spill over the barrier into the base which acts like a potential well and thereby increases its conductivity without the incorporation of excessive dopants. In all the materials, the doping level is about $10^{18}$ conductivity type determining impurities per $cm^{-3}$. Such a doping level leads to an equivalent spacing between donor sites of about 100 A and this is on the same scale as the layer thickness. As a result, only relatively few donors will be incorporated in the barrier, thereby leading to fluctuations in the potential barrier. This will cause minor quantitative change in the currents' values but qualitatively operation will not be effectively altered.

Referring to FIG. 4 in regard to the operation of the device. Since the base region is designed to permit hot electrons to traverse it with minimum scattering and minumum transit time, the only contribution to the collector current will be from the hot electrons. The collector current will be roughly independent of the base-collector voltage. This situation permits the dynamic resistance of the device to be very high and thus accommodate a large load impedance which in turn gives a good power gain. The power gain may be described as shown in Equation 3.

$$\text{Gain} \simeq \alpha^2 \frac{Z_L}{R_{in}} \quad \text{Equation 3}$$

where $R_{in}$ is input resistance between emitter and base, usually adjusted to 100 ohms.

$Z_L$ is the load impedance, and $\alpha$ is the transmission coefficient.

When the collector-base barrier is reversed biased, the barrier height will increase, thereby cutting off the collector current at a voltage $|V_{BC}| = V_{EB} - \phi_C$, illustrated in FIG. 4.

Referring next to FIG. 5. If the collector is shorted to the base, or is positively biased, and the emitter and base terminals are used in a two-terminal device mode, the input characteristics in a common emitter circuit configuration will follow the illustration of FIG. 5. As long as the emitter-base bias voltage is less than the collector barrier height, the collector current will be equal to the collector base current at $V_{EB}=0$ which is very small and hence the base current will be equal to the emitter current. When the emitter base bias voltage exceeds the collector barrier height, most of the emitter current will proceed to the collector, thereby reducing the base current to the value of the emitter current minus the collector current. This in turn is the equivalent of 1 minus the transmission coefficient $\alpha$ times the emitter current. Increasing the emitter base bias voltage will eventually increase the base current again due to the reduction of the mean-free path of the hot electrons in the base and the increase in the spreading of the energy distribution of the tunneling current in the emitter-base junction.

In the region of the graph of FIG. 5 wherein the emitter-base bias voltage is greater than the collector barrier, a negative resistance will be observed. Where materials such as GaAlAs are employed for the barrier regions the changing of the ratio of the aluminum and arsenic will change the collector barrier height and consequently the threshold of a negative resistance. Similarly, if the collector-base bias were to be changed such that it became less than 0, a similar effect would take place.

What has been described is a three-terminal semiconductor device wherein the relationship of barrier height, barrier width and base width have been interdependently arranged such that the dominating injection mechanism is tunneling and the dominating transfer and collection mechanism is due to hot majority carrier flow.

Having described the invention, what is claimed as new and what is desired to secure by letters patent is:

1. A semiconductor device comprising in combination a base region with a physical dimension of the order of the mean-free path of a majority carrier, an emitter region forming a first barrier of a first height with said base region and having a barrier width of the order to permit quantum mechanical tunneling;

a collector region forming a barrier with said base region lower than said first barrier and having a barrier width sufficient to inhibit quantum mechanical tunneling and an ohmic contact to each said emitter, said base and said collector regions.

2. The device of claim 1 wherein said emitter barrier height is of the order of two times the electron volt magnitude of said collector barrier height.

3. The device of claim 2 wherein the semiconductor material of said base region is GaAs.

4. The device of claim 2 wherein said base region is of GaAs of the order of 100 A wide, said emitter region barrier is of $Ga_xAl_{1-x}As$ where x equals of the order of 0.4, with a width of the order of 80 A and said collector region barrier is of $Ga_xAl_{1-x}As$ where x is of the order of 0.2 with a width of the order of 120 A.

5. A transistor of the type having an emitter region and a collector region each forming a rectifying contact with a base region, the improvement comprising in combination:

an emitter-base barrier height of a first magnitude with an emitter-base barrier thickness dimension of the order of a fraction of the length of the mean-free path of a majority carrier whereby in combination quantum mechanical tunneling carrier injection into said base region is provided;

an emitter-collector dimension in said base of the order of the length of the mean-free path of a majority carrier; and a base-collector barrier height less than the magnitude of said emitter-base barrier height with a base-collector barrier thickness of an order whereby in combination hot majority carrier current transfer in said base and said collector is provided.

6. The transistor of claim 5 wherein said magnitude of said emitter-base barrier height is of the order of twice that of said collector-base barrier height.

7. The transistor of claim 6 wherein said base region is GaAs.

8. The transistor of claim 5 wherein said base region is of GaAs of the order of 100 Å wide, said emitter-base barrier is of $Ga_xAl_{1-x}As$ where x is of the order of 0.4 and said barrier is of the order of 80 Å and said base-collector barrier is of $Ga_xAl_{1-x}As$ where x is of the order of 0.2 and said base-collector barrier is of the order of 120 Å.

* * * * *